(12) United States Patent
Sakano

(10) Patent No.: US 7,462,928 B2
(45) Date of Patent: Dec. 9, 2008

(54) SEMICONDUCTOR APPARATUS

(75) Inventor: Kensho Sakano, Tokushima (JP)

(73) Assignee: Nichia Corporation, Tokushima (JP)

( * ) Notice: Subject to any disclaimer, the term of this patent is extended or adjusted under 35 U.S.C. 154(b) by 95 days.

(21) Appl. No.: 11/270,495

(22) Filed: Nov. 10, 2005

(65) Prior Publication Data

US 2006/0102991 A1    May 18, 2006

(30) Foreign Application Priority Data

Nov. 12, 2004 (JP) ............................. 2004-328319
Mar. 29, 2005 (JP) ............................. 2005-093923

(51) Int. Cl.
*H01L 23/02* (2006.01)
(52) U.S. Cl. ................................................. 257/678
(58) Field of Classification Search ................. 720/635; 257/718, 79–81, 678
See application file for complete search history.

(56) References Cited

U.S. PATENT DOCUMENTS 3,974,002 A * 8/1976 Casey et al. ..................... 438/22
5,920,119 A * 7/1999 Tamba et al. .................. 257/718
6,667,941 B2 * 12/2003 Kabasawa .................... 720/635

FOREIGN PATENT DOCUMENTS

| JP | 11-74561 A | | 3/1999 |
| JP | 11074561 A | * | 3/1999 |
| JP | 2004-207672 A | | 7/2004 |
| JP | 2004228549 A | * | 8/2004 |

* cited by examiner

*Primary Examiner*—Jack Chen
*Assistant Examiner*—Monica D Harrison
(74) *Attorney, Agent, or Firm*—Birch, Stewart, Kolasch & Birch, LLP

(57) ABSTRACT

A semiconductor apparatus according to the present invention comprises a support member that has a recessed portion, one pair of positive and negative conductive wiring members that are provided on the support member, a semiconductor device that is electrically connected to the conductive wiring members and is disposed in the recessed portion, and a coating member that seals at least the semiconductor device. Side walls of the recessed portion has a first side wall 105 that surrounds the semiconductor device 103, and the second side wall 106 that protrudes from the first side wall. At least a first wall surface 106*a* in the bottom side of the recessed portion in wall surfaces of the second side wall 106 is coated with a metallic material. Consequently, a highly reliable semiconductor apparatus with improved light-outgoing efficiency is provided.

9 Claims, 6 Drawing Sheets

SEMICONDUCTOR APPARATUS

BACKGROUND OF THE INVENTION

1. Field of the Invention

The present invention relates to a semiconductor apparatus with a semiconductor light emitting device such as light emitting diode and laser diode, or a photoreceptor such as photo diode mounted thereon.

2. Description of the Related Art

A semiconductor light emitting device such as light emitting diode and laser diode is mounted on a support member, and thus a semiconductor apparatus is configured. This can protect the semiconductor light emitting device from the environmental influence, and provide an electrical connection to external electrode terminals. As such a support member, a support member of a ceramic material with high light resistance and durability is used. In addition, in order to protect a semiconductor device provided on this type of support member from environmental influence, the semiconductor device is coated with a transparent resin.

For example, in a semiconductor apparatus disclosed in Japanese Laid-Open Patent Publication TOKUKAI No. HEI 11-74561, a semiconductor device is disposed in a recessed portion of a support member, and a silicone resin as a coating member fills in the recessed portion to seal the semiconductor device. In addition, in order to prevent peeling-off of the silicone resin, which has low bonding characteristics with a ceramic material, the support member of a ceramic material includes retaining means for fixedly retaining the silicone resin in the recessed portion. The retaining means protrudes inwardly within the recessed portion, and engages with the periphery of the silicone resin provided in the recessed portion.

Accordingly, the coating member is not peeled off from the support member, and thus it is possible to provide a highly reliable semiconductor apparatus. The ceramic support member with this type of retaining means can be relatively easily formed by burning laminated structural component of various ceramic green sheets having holes with different aperture diameters.

SUMMARY OF THE INVENTION

However, the retaining means of the aforementioned ceramics support member is formed so as to protrude from an inner wall surface that forms the recessed portion. This type of protrusion cuts off a part of light that goes out from the light emitting device disposed in the recessed portion of the support member. In other words, since a wall surface of the protrusion absorbs or scatters light from the light emitting device, light-outgoing efficiency of the semiconductor light emitting apparatus is reduced.

Furthermore, a work instrument, so-called a mounter moves and disposes the semiconductor apparatus at a predetermined position in a manufacturing process. In this case, a fore end of a collet of the mounter comes in contact with the periphery of an opening of the recessed portion in a support member principle side, and sucks and holds the support member. That is, the fore end of the collet directly affects the retaining means that protrudes around the periphery of the opening of the recessed portion of the support member. For this reason, the retaining means that protrudes around the periphery of the opening may suffer damage such as chipping and cracking. Such small chipping and cracking around the opening may causes large cracking that entirely extends the support member.

Moreover, in the recessed portion of the ceramic package disclosed in the above Japanese Laid-Open Patent Publication TOKUKAI No. HEI 11-74561, a corner defined by a wall surface in the bottom side of the recessed portion and a back surface of the protrusion is spatially narrow. Accordingly, air bubbles tend to remain in the corner in a process where the recessed portion is filled and sealed with a material of the coating member. If extending toward and existing in a light-observation surface of the coating member, a part of bubbles may cast a shadow on a light arrangement pattern that is formed of illuminated light from the light emitting device.

Therefore, in a semiconductor apparatus that has a protrusion around an opening of a recessed portion of a support member with a semiconductor device mounted thereon to reduce an aperture diameter of the recessed portion, it is an object of the present invention to improve light-outgoing efficiency from a light emitting device. It is another object to prevent damage of retaining means formed around an opening of a support member in order to provide a highly reliable semiconductor apparatus. It is still another object to provide a semiconductor apparatus without remaining air bubbles in a recessed portion that affect optical characteristics of the semiconductor apparatus.

To achieve the above objects, a semiconductor according to the present invention comprises a semiconductor device; a support member having a recessed portion that mounts the semiconductor device therein and has a protrusion on a side surface of the recessed portion; and a coating member that seals the semiconductor device in the recessed portion, wherein at least a wall surface of the protrusion facing the bottom side of the recessed portion is coated with a metallic material. Accordingly, the protrusion does not substantially cause reduction of the light-outgoing efficiency or mechanical damage of the support member. Therefore, it is possible to provide a highly reliable semiconductor apparatus with excellent optical characteristics.

Alternatively, a semiconductor according to present invention comprises a semiconductor device; a support member having a recessed portion that mounts the semiconductor device therein, and has a first side wall 105 in the bottom side and a second side wall 106 protruding in the opening side; and a coating member that seals the semiconductor device in the recessed portion, wherein at least a first wall surface 106a in the bottom side of the recessed portion in wall surfaces of the second side wall 106 is coated with a metallic material. That is, the protrusion protrudes in the opening side of the recessed portion. This allows the support member to firmly retain the coating member. Therefore, according to the present invention, it is possible to provide a highly reliable semiconductor apparatus with excellent optical characteristics.

It is preferable that a tangent plane at the top surface of the metallic material disposed on the side wall of the recessed portion intersects the second side wall 106. Accordingly, the coating member can be fastened and held in the recessed portion. Therefore, it is possible to provide a highly reliable semiconductor apparatus. In addition, the side wall of the recessed portion reflects light from the light emitting device. Therefore, it is possible to provide a light emitting apparatus with improved light-outgoing efficiency. Additionally, it is possible to provide an optical semiconductor apparatus with improved light-collecting characteristics to a photoreceptor device.

It is preferable that the metallic material extends from the first side wall 105 to the second side wall 106. This can improve strength of the protrusion composed of the second side wall. Therefore, it is possible to provide a highly reliable semiconductor apparatus. In addition, it is preferable that the metallic material is formed in a convex shape on the wall surface 105*a* of the first side wall 105, and is disposed in a concave shape at the corner defined by the first wall surface 106*a* and the wall surface 105*a*. This structure suppresses air bubbles that remain at the corner. Consequently, in a semiconductor apparatus according to the present invention, it is possible to suppress deterioration of optical characteristics, and to improve reliability of the semiconductor apparatus.

It is preferable that the metallic material extends on the second side wall 106 from the first wall surface 106*a* to an adjacent wall surface. Accordingly, since mechanical strength of the protrusion is improved, it is possible to prevent mechanical damage of the support member Therefore, in the semiconductor apparatus, it is possible to improve reliability thereof.

The support member includes the coating member, which seals at least the semiconductor device, and it is preferable that the coating member is a material including at least one selected from the group consisting of a silicone resin and an epoxy resin. Accordingly, the semiconductor device is protected from the environmental influence, and thus it is possible to provide a highly reliable semiconductor apparatus. Additionally, it is preferable that the support member is composed of ceramic. In this case, since heat resistance is improved, it is possible to provide a highly reliable semiconductor apparatus.

It is preferable that the metallic material contains at least one element selected from the group consisting of tungsten (W), molybdenum (Mo), manganese (Mn) and tantalum (Ta). This can improve mechanical strength of the protrusion, therefore, it is possible to provide a highly reliable semiconductor apparatus.

In a support member employed in the present invention, a metallic material is coated on a wall surface of a protrusion as means for retaining a coating member. This can suppress damage of the protrusion in a semiconductor apparatus. Therefore, it is possible to provide a highly reliable semiconductor apparatus.

In the support member, a metallic material disposed on a wall surface of a protrusion reflects light from a light emitting device. The light reflected by the wall surface of the protrusion is reflected by wall surfaces surrounding the light emitting device, and goes out through an opening. Therefore, a light emitting apparatus according to the present invention can have improved light-outgoing efficiency of the light emitting device.

In a support member of the present invention, a metallic material is disposed on a side wall of a recessed portion of the support member such that its top surface can be a curved surface. Particularly, at a corner defined by a wall surface of a protrusion and a wall surface in the inner side of the recessed portion, the top surface of the metallic material is formed so as to be a concave curved surface. This structure suppresses air bubbles, which can remain in a process for forming a coating member, and air bubbles included in a material of the coating member are efficiently removed. Therefore, it is possible to provide a semiconductor apparatus with less deterioration of optical characteristics. The above and further objects and features of the present invention will more fully be apparent from the following detailed description with accompanying drawings.

DETAILED DESCRIPTION OF THE PREFERRED EMBODIMENTS

Figure 1:
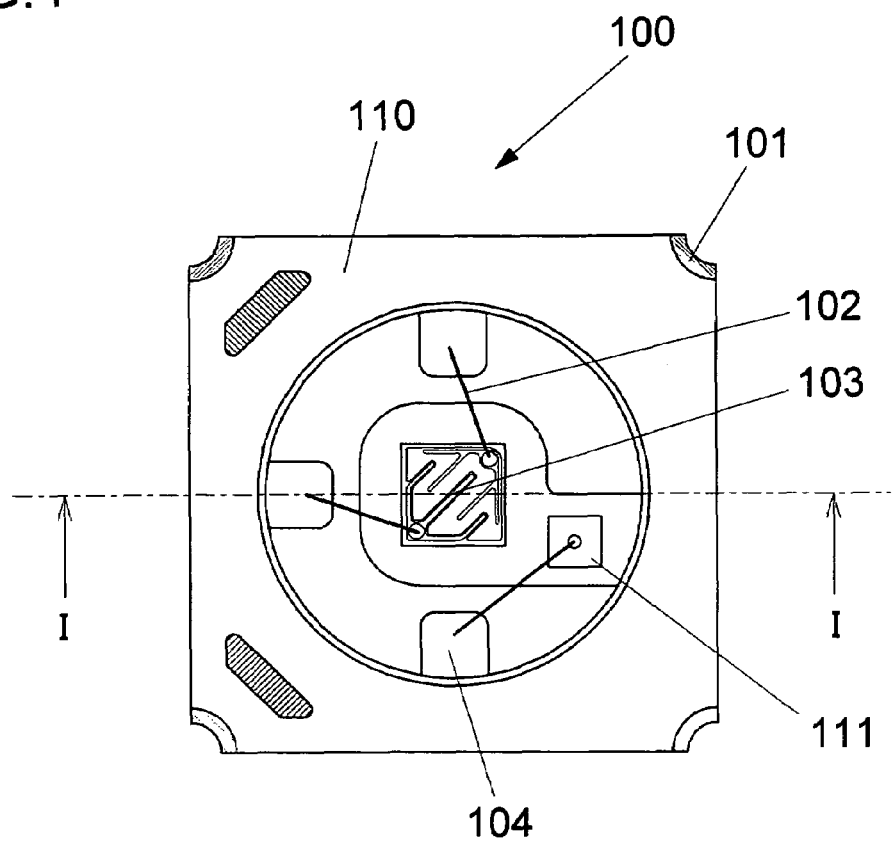
FIG. 1 is a plan view schematically showing a semiconductor apparatus according to one embodiment of the present invention.

Preferred embodiments according to the present invention are described with reference to the drawings. It should be appreciated, however, that the embodiments described below are illustrations of a semiconductor apparatus to give a concrete form to technical ideas of the invention, and the semiconductor apparatus of the invention is not specifically limited to description below. Furthermore, it should be appreciated that the members shown in claims attached hereto are not specifically limited to members in the embodiments. Unless otherwise specified, any dimensions, materials, shapes and relative arrangements of the parts described in the embodiments are given as an example and not as a limitation. Additionally, the sizes and the arrangement relationships of the members in each of drawings are occasionally shown larger are exaggerated for ease of explanation. Members same as or similar to those of this invention are attached with the same designation and the same reference numerals and their description is omitted. In addition, a plurality of structural elements of the present invention may be configured as a single part which serves the purpose of a plurality of elements, on the other hand, a single structural element may be configured as a plurality of parts which serve the purpose of a single element.

In a semiconductor apparatus including a support member that has a recessed portion, one pair of positive and negative conductive wiring members that are provided on the support member, and a semiconductor device that is electrically connected to the conductive wiring members and is disposed in the recessed portion, in order to solve the aforementioned problems, the inventor of the present invention has conducted various studies. As a result, he has found that the aforementioned problems are solved by a side wall of the recessed portion including a first side wall that forms a wall surface in the bottom side of the recessed portion and a second side wall that protrudes in the opening side of the recessed portion toward a side where a bore of the recessed portion decreases from the first side wall, the second side wall having at least a wall surface adjacent to the first side wall surface in the bottom side of the recessed portion in the second side wall surfaces of the protrusion (in this specification, occasionally referred to as a "back surface of the protrusion") is coated with a metallic material. That is, the semiconductor apparatus according to the present invention includes at least a wall surface in the bottom side of a recessed portion in wall surfaces of a protrusion is coated with a metallic material.

Figure 7:
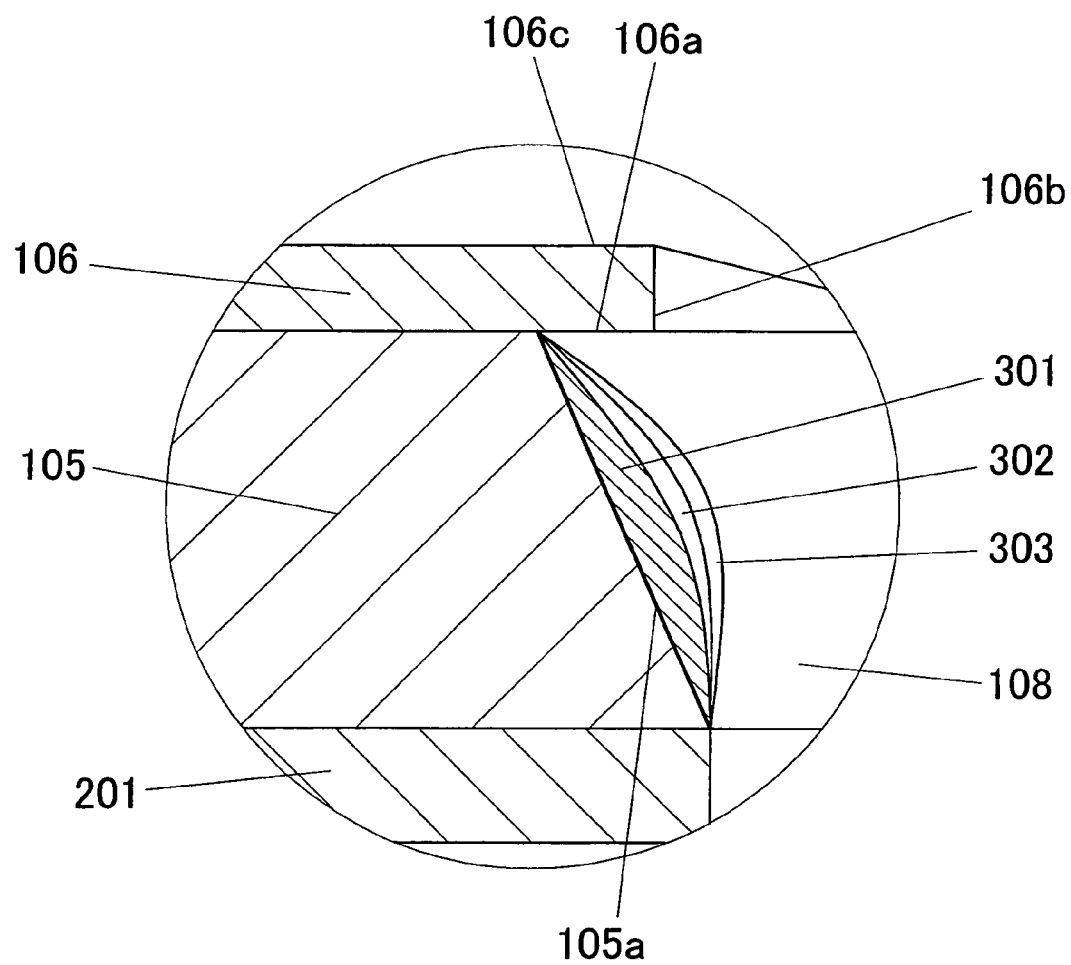
FIG. 7 is an enlarged partial cross-sectional view showing a conventional semiconductor apparatus.

As discussed above, since a support member composed of ceramic has excellent light resistance and heat resistance, it is preferably used as the support member that mounts the semiconductor device thereon. In addition, a high light-resistant material such as silicone resin is preferably used as a coating member that coats the semiconductor device. For example, as shown in FIG. 7, a conventional support member includes retaining means for retaining a coating member 108, which has low bonding characteristics with a material of the support member, in a recessed portion without peeling it off from the support member. However, this retaining means is formed in a protrusion composed of a first wall surface 106a and a second wall surface 106b. That is, the retaining means is formed in the upper side than the coating member provided in the recessed portion to protrude inwardly within the recessed portion so as to engage with the periphery of the coating member.

Furthermore, since a member composed of ceramic is porous in proximity of its surface, it tends to absorb or scatter light. Accordingly, since this type of protrusion cuts off, absorbs and scatters light from a light emitting device that is disposed in an opening of the support member, for example, light-outgoing efficiency of the semiconductor light emitting apparatus reduces. Particularly, as shown in FIG. 7, a corner defined by a back surface of the protrusion and a wall surface 105a of a first side wall 105 is spatially narrow. Such a shape causes loss of light from the light emitting device and reduction of light-outgoing efficiency of a semiconductor apparatus.

Moreover, a work instrument, so-called a mounter moves and disposes a semiconductor apparatus that includes a support member having this type of protrusion at a predetermined position in a manufacturing process. For example, the semiconductor apparatus is sucked by a vacuum disposed at a fore end of a collet of the mounter, and arranged and soldered on wiring members of a mount circuit board. In this case, the fore end of the collet comes in contact with the periphery of an opening of a recessed portion, and sucks the support member of the semiconductor apparatus. A semiconductor device chip is die-bonded on the bottom surface of the recessed portion of the support member by a chip die-bonder. In this case, a collet fore end of the chip die-bonder could come in contact with the protrusion around the opening of the recessed portion. In other words, in manufacturing processes, various work instruments mechanically and directly affects retaining means that protrudes around the periphery of the opening of the recessed portion of the support member. For this reason, the retaining means that protrudes around the periphery of the opening may suffer damage such as chipping and cracking. In particular, although a support member of a ceramic material has certain strength and excellent durability, if small chipping and cracking occur around the periphery of the opening once, later, this may cause large cracking that entirely extends the support member.

Figure 2:
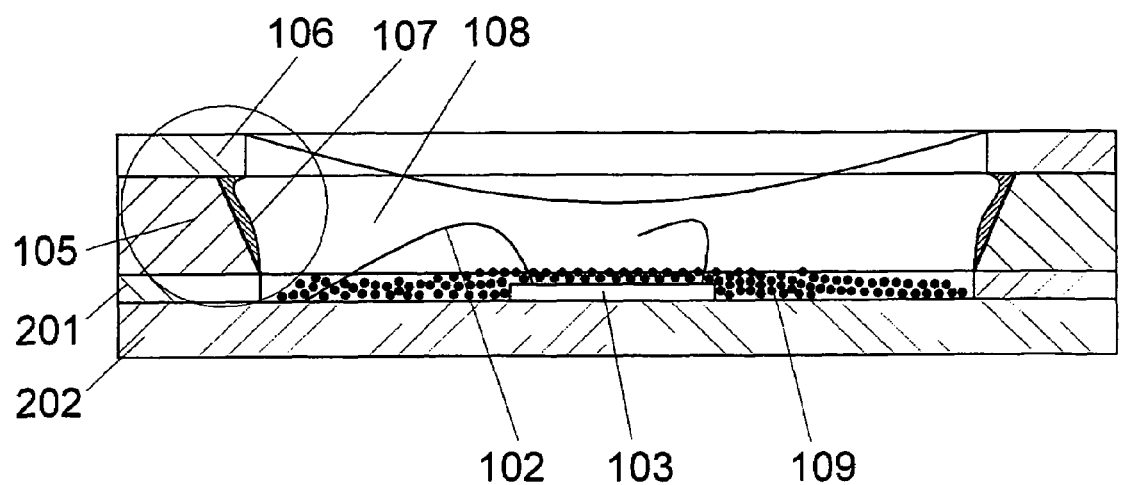
FIG. 2 is a cross-sectional view schematically showing a semiconductor apparatus according to one embodiment of the present invention.

Therefore, to solve the above problems, in the present invention, in a side wall that protrudes inwardly of a recessed portion of a support member, at least a wall surface in the bottom side is coated with a metallic material. FIG. 1 is a plan view schematically showing a semiconductor apparatus according to this embodiment. FIG. 2 is a cross-sectional view along a dashed line 1-1 of FIG. 1. FIGS. 3 to 6 are enlarged partial views inside a circle of FIG. 2.

A protrusion of a support member 110 according to this embodiment is a portion of a second side wall 106 that protrudes inwardly within the recessed portion. The second side wall 106 has a first wall surface 106a in the bottom side, a second wall surface 106b adjacent to the first wall surface 106a, and a third wall surface 106c adjacent to the second wall surface 106b. As for wall surfaces that form the protruding portion, a wall surface that is coated with a metallic material is not limited to the first wall surface 106a in the bottom side. In other words, needless to say, the metallic material can coat not only the first wall surface 106a but also other wall surface adjacent thereto.

Figure 5:
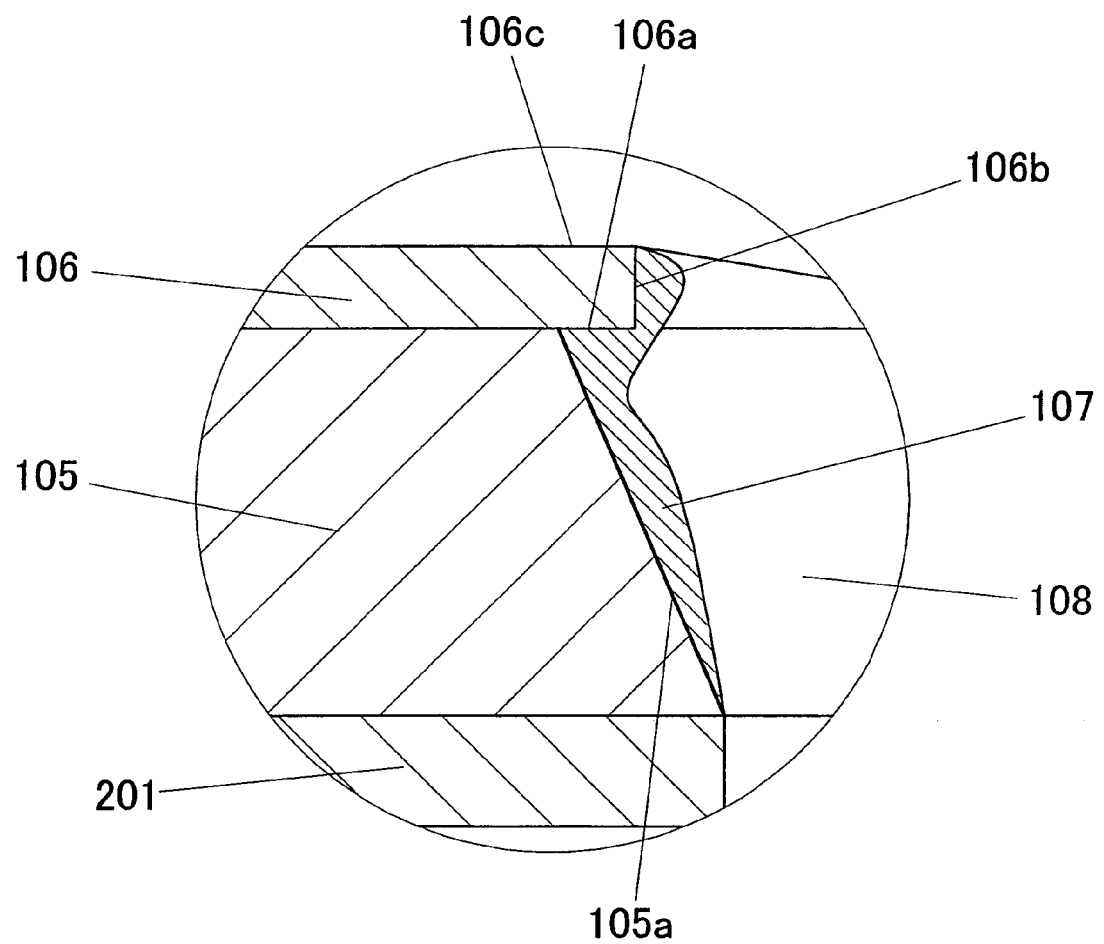
FIG. 5 is an enlarged partial cross-sectional view showing a semiconductor apparatus according to one embodiment of the present invention.

For example, as shown in FIG. 5, it is preferable that the metallic material is disposed smoothly and continuously from the first wall surface 106a to the second wall surface 106b adjacent to the first wall surface 106a. In this case, the side wall of the recessed portion reflects light from a light emitting device, therefore, it is possible to provide a light emitting apparatus with improved light-outgoing efficiency. Additionally, it is possible to provide an optical semiconductor apparatus with improved light-collecting characteristics to a photoreceptor device. In addition, as shown in FIG. 5, the metallic material is formed in a convex shape on the second wall surface 106b. This can improve mechanical strength of the protrusion.

Figure 6:
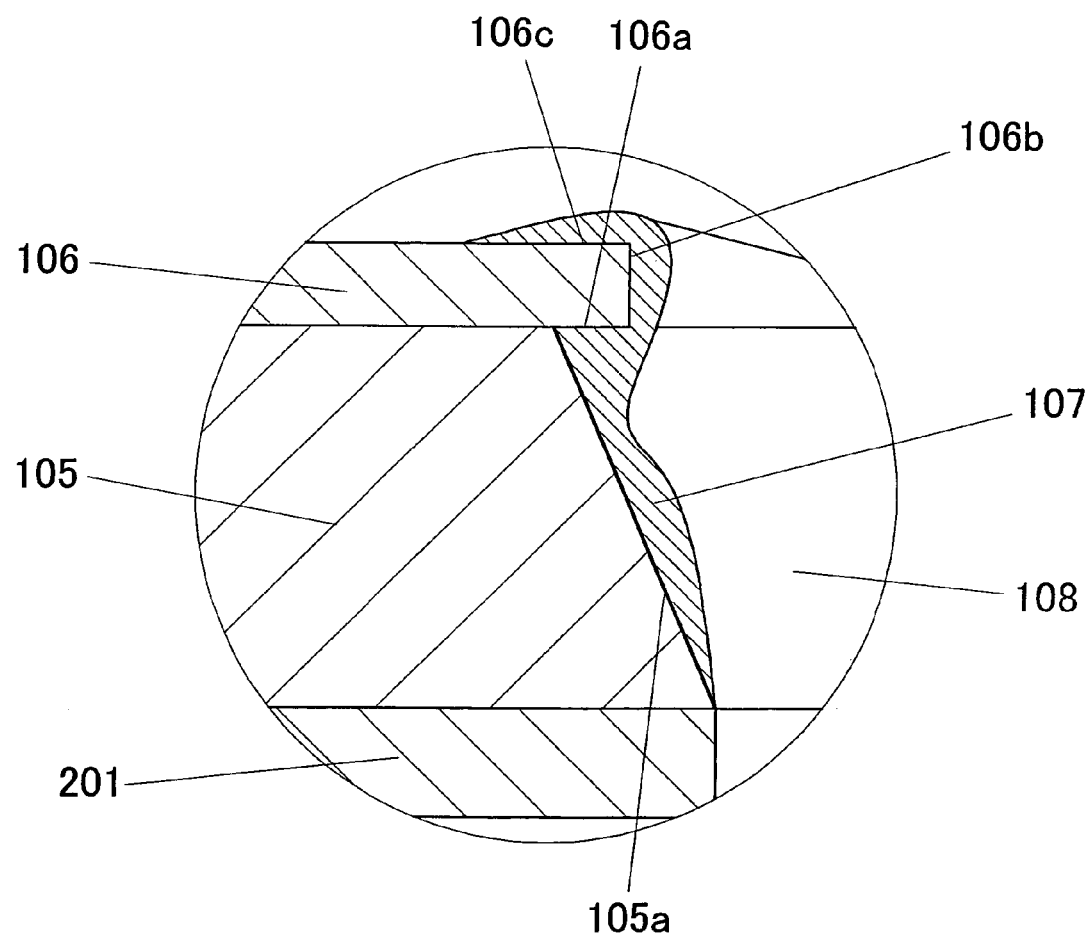
FIG. 6 is an enlarged partial cross-sectional view showing a semiconductor apparatus according to one embodiment of the present invention.

In addition, as shown in FIG. 6, it is preferable that the metallic material entirely coats the wall surfaces that form the protrusion. In other words, it is preferable that the metallic material smoothly and continuously coats the first, second and third wall surfaces 106a, 106b and 106c, in a portion where the second side wall protrudes. Accordingly, the metallic material reflects light from the semiconductor light emitting device, and thus the light can go out from the recessed portion. Additionally, the metallic material improves mechanical strength of a side wall portion that protrudes inwardly within the recessed portion of the support member. Accordingly, the support member does not suffer damage in manufacturing processes. Therefore, it is possible to provide a highly reliable semiconductor apparatus.

It is preferable that the metallic material, which coats the wall surface of the protrusion, contains at least one element selected from the group consisting of tungsten (W), molybdenum (Mo), manganese (Mn) and tantalum (Ta). These metallic materials have excellent physical characteristics such as high tensile strength, high elasticity, high strength even at high temperature, and small thermal expansion coefficient as compared with other metals. This can improve mechanical strength of the protrusion. Therefore, it is possible to provide a highly reliable semiconductor apparatus.

It is preferable that the support member further has a laminated metallic layer that has nickel (Ni), gold (Au) or silver (Ag) laminated on the above-mentioned metallic material. Particularly, silver with high light reflectivity is selected as a metallic material of the top surface of the metallic layer. This can improve light reflectivity of the inner wall surface of the recessed portion and light-outgoing efficiency of the light emitting device, or can provide a semiconductor apparatus with improved light-collecting characteristics, which is desirable for a photoreceptor device.

Figure 3:
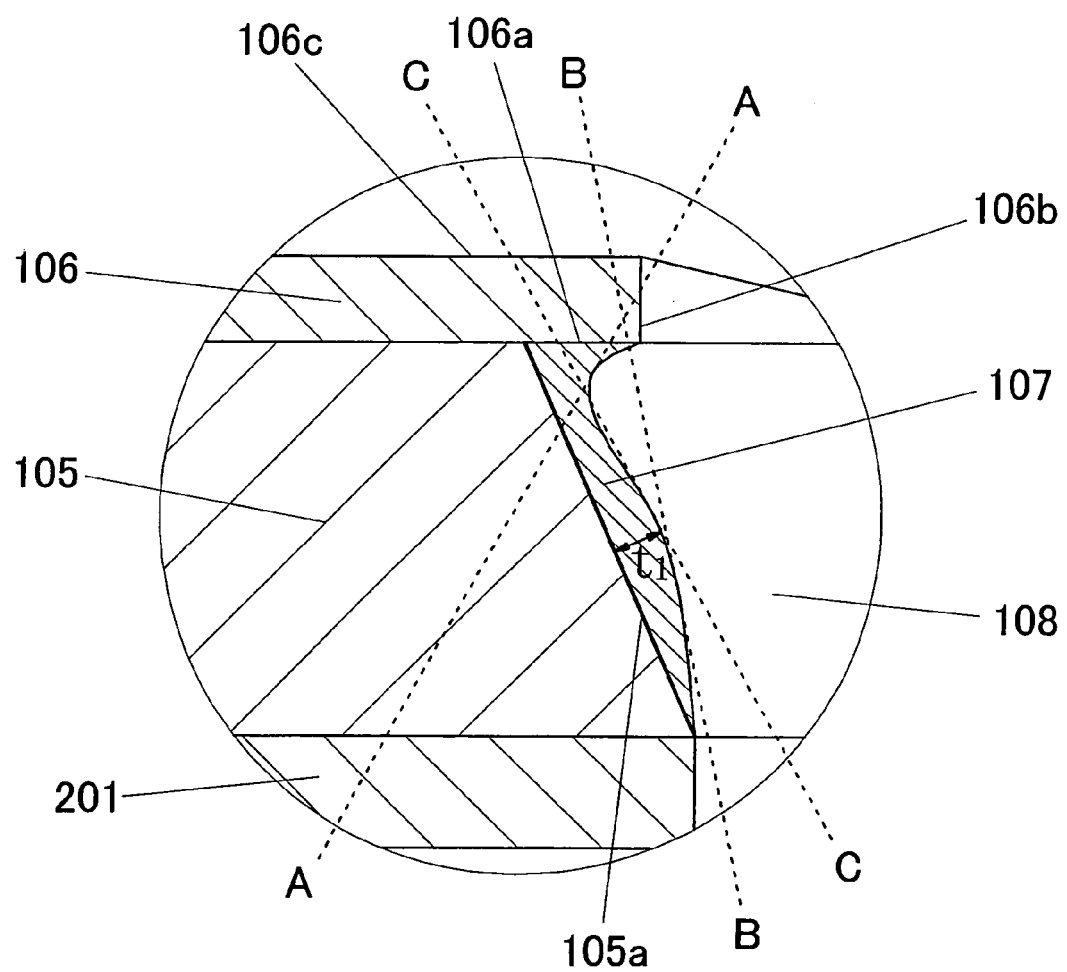
FIG. 3 is an enlarged partial cross-sectional view showing a semiconductor apparatus according to one embodiment of the present invention.
Figure 4:
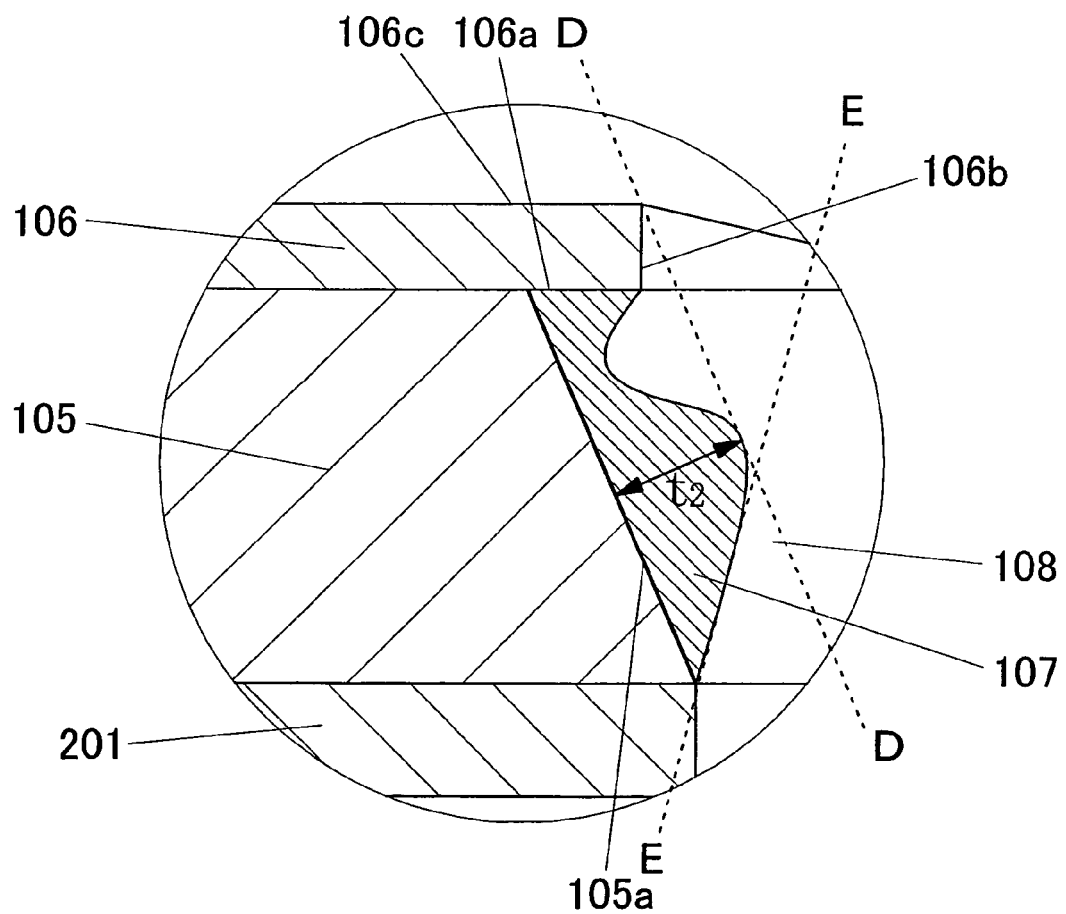
FIG. 4 is an enlarged partial cross-sectional view showing a semiconductor apparatus according to one embodiment of the present invention.

As shown in FIGS. 3 and 4, the metallic material that located on the wall surface 105a of the first side wall 105 can have a convex shape that expands inwardly of the recessed portion at a portion where its thickness is the maximum. In addition, in the case where the metallic material, as shown in FIG. 3 or 4, serves as a first metallic material 301, and a second metallic material 302 and a third metallic material 303 are laminated thereon as shown in FIG. 7, a metallic material composed of these metallic materials has a convex shape that further expands. Note that t1 and t2 in Figures show the heights from the wall surface 105a to the top of the metallic material at a portion where the thickness of the metallic material that expands in a convex shape is the maximum.

Further, the metallic material located on the wall surface 105a of the first side wall 105 has the minimum thicknesses in proximity of a corner defined by the wall surface 105a and the first wall surface 106a, and a portion of the wall surface 105a adjacent to the third side wall 201 side surface.

Since the protrusion of the second side wall 106 serves as retaining means, it is required that the protrusion protrudes a certain amount inwardly within the recessed portion. On the other hand, in the case where an optical semiconductor device is mounted in a semiconductor apparatus, the amount of protrusion from the side wall of the recessed portion should be arranged in order to obtain the opening of the recessed portion where light goes out or enters. The metallic material, which is formed in a shape expanding inwardly within the recessed portion, reduces an interval to the back surface of the protrusion, and thus this may impair the function of the protrusion as retaining means. For this reason, the height (t1) from the wall surface 105a of the first side wall 105 to the top of the metallic material 107 is limited to a certain extent.

Accordingly, it is preferable that a tangent plane at an arbitrary point on the top surface of the metallic material according to this embodiment intersects the second side wall 106. Note that, in this case, the metallic material is located from the wall surface 105a of the first side wall 105 to the first wall surface 106a. The following description will describe this with reference to drawings.

On the assumption of tangent planes at arbitrary points on the top surface of the metallic material, dotted lines A-A, B-B and C-C shown in FIG. 3 show the lines of intersection between the tangent planes and a cross-sectional plane. The metallic material is formed such that its top surface has a convex curved surface on the wall surface 105a, and is formed such that its top surface has a concave curved surface at the corner defined by the wall surface 105a and the first wall surface 106a. It is preferable that a tangent plane at the top surface of the metallic material intersects the side wall having the protrusion. That is, it is preferable that the dotted lines A-A, B-B and C-C shown in FIG. 3 intersect the second side wall 106.

Adjustment of shape or thickness of a metallic layer as discussed above allows the protrusion of the second side wall 106 to serve as means for retaining the coating member 108, and prevent peeling-off of the coating member 108. Therefore, it is possible to provide a highly reliable semiconductor apparatus. In addition, the tangent plane intersects the side wall having the protrusion, and thus light, which is reflected by the top surface of the metallic material, can efficiently go out through the opening, and light that enters through the opening is reflected by the top surface of the metallic material and can efficiently gather in the recessed portion.

Additionally, as shown in FIG. 4, the metallic material 107 can be formed on the first side wall 105 such that the tangent plane does not intersect the second side wall 106. That is, as shown by dotted lines D-D and E-E, tangent planes at the top surface of the metallic material 107 can extend within the opening side of the recessed portion. In this case, the height (t2) from the wall surface 105a of the first side wall 105 to the top of the metallic material is higher than the height (t1) of the top of the aforementioned metallic material. Accordingly, a portion from the top of the metallic material formed in a convex shape to the recessed portion in the bottom side can serve as means for retaining the coating member. In other words, the coating member engages with the portion extending from the top of the metallic material to the bottom side, and thus is held in the recessed portion without dropping off.

As shown in FIG. 7, the corner defined by the wall surface 105a and the above first wall surface is spatially narrow. Accordingly, air bubbles tend to remain in a process that fills a material of the coating member 108 (a process that seals the recessed portion). When these air bubbles extend toward and exist in a light emission surface of the light emitting apparatus, the air bubbles cut off light from the light emitting device and may cast a shadow on a light arrangement pattern of the light emitting apparatus.

For this reason, as shown in FIGS. 3 to 6, it is preferable that the metallic material according to this embodiment is formed so as to extend from the first side wall 105 to the second side wall 106 such that its top surface has a curved surface. In other words, as shown in FIGS. 3 to 6, it is preferable that the above metallic material formed so as to extend from the wall surface 105a of the first side wall 105 to the first wall surface 106a of the second side wall 106 in a predetermined curvature. In addition, as shown in FIGS. 3 to 6, it is preferable that the metallic material is formed such that its top surface has a convex curved surface on the wall surface 105a, and is formed such that its top surface has a concave curved surface from the wall surface 105a to the first wall surface 106a adjacent thereto. That is, it is preferable that the metallic material is formed such that its top surface has a convex curved surface that protrudes inwardly within the recessed portion in the first side wall 105, and is formed in a curved surface that is bowed toward the corner defined by the first side wall 105 and the second side wall 106.

This structure suppresses air bubbles, which remain in the corner defined by the side wall forming the protrusion and the wall surface in the bottom side of the recessed portion. That is, due to the metallic material that is formed such that its top surface has a smooth curved surface, air bubbles, which appear in proximity of the side wall of the recessed portion smoothly are moved out of the support member. In addition, air bubbles, which are included in a material of the coating member, are also efficiently removed. Therefore, it is possible to provide a semiconductor apparatus without deterioration of optical characteristics. The components employed in the present invention will be described.

(Support Member)

The support member according to this embodiment has the recessed portion to dispose the semiconductor device therein and protects the semiconductor device or a conductive wire from environmental influence. The recessed portion has the first side wall 105 in the bottom side, and the second side wall, which reduces the aperture diameter of the recessed portion. The first side wall 105 surrounds the semiconductor device in the bottom side of the recessed portion. The second side wall 106 protrudes in the opening side inwardly within the recessed portion, and serves as means for retaining the coating member 108.

The support member is provided with conductive wiring members, which provide electrical connection of the semiconductor device disposed therein. This type of support member can have various shapes and sizes depending on the number of semiconductor devices or the size of a semiconductor device disposed in the apparatus. A glass epoxy substrate, a substrate made of a BT resin material, and a substrate made of a ceramic material can be given as examples of this type of support member. In addition, pluralities of plate-shaped members with a hole formed thereon are stacked, and then the support member having the protrusion around the opening of the recessed portion can be formed. In case where the support member is composed of a structural component of laminated plate-shaped members, it is preferable that a metallic material to be located on the back surface of the protrusion is interposed between the plate-shaped member that forms the first side wall and the plate-shaped member that forms the second side wall. A plate-shaped member made of a metallic material, a insulating plate-shaped member that is provide with a metallic material formed thereon by plating, sputtering or deposition can be also used as this type of member. The same goes for the case where the support member is composed of a structural component of laminated ceramic green sheets as discussed below. This prevents the metallic material from peeling off from the second side wall, and can securely hold the metallic material. In the case where the above metallic material is plated as a primary layer, plating can be preferably conducted even in an intersectional linear part where the wall surface 105a of the first side wall 105 and the first wall surface 106a intersect each other.

The support member made of a suitable ceramic material in this embodiment can be relatively easily formed to have shapes of the recessed portion that disposes the semiconductor device and the protrusion that serves as retaining means by burning ceramic green sheets that have various shapes of holes and are stacked in multiple layers. A material containing at least one selected from the group consisting of aluminum oxide, aluminum nitride and mullite can be employed as a material of this type of ceramic. The support member is made of this type of material, and thus it is possible to provide a high heat resistant semiconductor device. Since aluminum nitride has high heat conductivity as compared with other ceramic materials. Particularly, when the support member is made of aluminum nitride, it is possible a semiconductor apparatus with high heat dissipation characteristics. Resin as a binder is mixed and kneaded with this type of material, and then formed in a sheet shape. Consequently, a ceramic green sheet is obtained.

In addition, in the case where a resin paste containing high melting-point metals such as W (tungsten), Mo (molybdenum), Mn (manganese) and Ta (tantalum) is printed on a ceramic green sheet, a predetermined wall surface of the support member can be coated with the high melting-point metals. The convex-concave shape of the metallic material on the first and second side wall can be obtained by adjusting viscosity or surface tension of the above resin paste. Additionally, the conductive wiring members arranged on the support member can be easily formed in various wiring patterns by the above resin paste. Particularly, among the aforementioned high melting-point metals, W (tungsten) has excellent physical characteristics such as high tensile strength, high elasticity and high strength even in a high temperature as compared with other metals, and the smallest thermal expansion coefficient in metals. A metal with high mechanical strength is coated on wall surface that forms the protrusion of the support member, and thus this can prevent damage of the protrusion in a semiconductor apparatus. Therefore, it is possible to provide a highly reliable semiconductor apparatus. These high melting-point metals are suitable as a material for the support member, which mounts a semiconductor such as LED and LD generating a large amount of heat.

Moreover, in the case where the support member mounts a semiconductor light emitting device such as LED and LD generating a large amount of heat, the temperature of the semiconductor light emitting device rises and it may cause variation of light emission luminance or wavelength in light emission. For this reason, it is desired that the support member has high heat dissipation property in order to efficiently dissipate heat from the light emitting device. In terms of downsizing, heat resistance and durability, ceramic can be given as an example of excellent material that forms the support member.

(Retaining Means)

The retaining means in this embodiment retains the coating member in the recessed portion such that the coating member located in the recessed portion of the support member does not peel off from the support member. A hole or a groove provided on side wall within the recessed portion of the support member, or a protrusion on or a hook within an inner wall surface of the recessed portion of the support member can be given as examples of the retaining means. Particularly, retaining means composed of a part of inner wall surface of the recessed portion that partially protrudes such that its bore is narrower toward the opening of the recessed portion in the principle surface side of the support member can be preferably used. In addition, this type of retaining means can be provided at a plurality of locations, and retaining means having various shapes can be combined. FIGS. 1 to 6 show examples of the semiconductor apparatus according to this embodiment. The semiconductor apparatus according to this embodiment includes retaining means composed of a protrusion that reduces size of the opening where the semiconductor device is disposed in the principle surface side of the support member. Accordingly, the retaining means can be configured in relatively simple construction.

(Coating Member)

The coating member (occasionally, referred to as a "sealing member") protects the semiconductor device and conductive wires disposed inside the recessed portion of the support member from moisture, external force, and so on. Silicone resin, epoxy resin and urea resin can be given as examples of material of the coating member according to this embodiment. Particularly, a silicone resin is a suitable material in this embodiment since it has poor physical strength and low bonding characteristics as compared with other resins such as epoxy resin. In addition, its thermal expansion coefficient is high. On the other hand, a silicone resin has excellent heat resistance and light resistance as compared with other resins, and does not tend to be colored and deteriorate even under high-energy, short wavelength light containing ultraviolet rays. Accordingly, even in the case where a light emitting apparatus has a phosphor material and emits mixed light of light from light emitting device and luminescent radiation is emitted, it is possible to suppress color difference and color unevenness. Additionally, even if the coating member is repeatedly thermally expanded and contracted by soldering or the like, the conductive wires that connect the semiconductor and the conductive wiring members are not disconnected, and a die-bonding member is not peeled off.

A silicone resin that is a material of the coating member has high tackiness as compared with other resins. The coating member of a silicone resin material tends to rise along the side wall of the recessed portion of the support member toward the opening direction due to its surfacetension. If the coating member. rises outside the recessed portion of the support member, the coating member tends to suffer from external influence. That is, the coating member that lies off the recessed portion may cause adhesion of support members to each other in a manufacturing process (for example, selection of the semiconductor apparatus by a ball feeder, or packaging of the semiconductor apparatus by taping), and may reduce workability.

For this reason, the silicone resin disposed in the recessed portion of the support member is preferably located inside than the principle surface of the support member. This prevents adhesion of support members to each other in a manufacturing process. In addition, the protrusion formed in the opening can prevent resin from rising toward the principle surface direction of the support member. Further, the silicone resin does not overflow out of the support member, and it is possible to prevent or minimize peeling-off of the silicone resin due to contact with a protrusion external of the semiconductor apparatus. Particularly, the above coating member preferably extends so as to coat a portion corresponding to the concave surface in the metal surface located on the side wall of the aforementioned recessed portion. Accordingly, it is possible to prevent the coating member from peeling off from the support member, and to provide a highly reliable semiconductor apparatus.

The coating member can contain various materials such as a coloring agent, light stabilizing material, a phosphor substance, if required. Specifically, depending on light emission wavelength of the light emitting device or reception wavelength, the coating member can contain a coloring agent such as pigment and dye in order to cut off unnecessary wavelength.

(Phosphor Substance)

In this embodiment, when the semiconductor apparatus includes a semiconductor light emitting device such as light emitting diode and laser diode, a phosphor substance that is excited by light from the semiconductor light emitting device and emits luminescent radiation of different wavelength can be employed. Various phosphor substances such as inorganic and organic phosphors can be disposed or included in each component and/or the periphery of each component, for example, (1) a semiconductor device structure or a protection film of the semiconductor light emitting device, (2) a coating member that coats the light emitting device or a sub-mount on which the light emitting device is mounted, (3) a die-bonding material that fastens the light emitting device or a sub-mount on which the light emitting device is mounted onto a support body, and (4) a support base such as sub-mount and package. Particularly, a phosphor substance to be combined with the coating member can be formed in a sheet shape so as to coat a light-observation surface side of the coating member. Alternatively, a phosphor substance can be disposed inside the coating member at location spaced at an interval from the light-observation surface side of the coating member and the light emitting device as a layer, sheet, cap or filter containing a phosphor. It is preferable that a wavelength conversion member, which is formed so as to coat the light emitting device mounted in a flip chip mounting manner, is formed of a binding material containing a phosphor by screen printing with a metal mask or a screen plate, or mimeograph printing. In case of formation as discussed above, it is possible to easily form the wavelength conversion member with uniform thickness in the periphery of the light emitting device.

A phosphor applicable to the semiconductor apparatus according to this embodiment absorbs a part of visible light or ultraviolet light from the light emitting device and emits luminescent radiation of wavelength different from the absorbed light. The phosphor used in this embodiment absorbs at least a part of light emitted from the light emitting device, emits luminescent radiation of converted wavelength and composes the wavelength conversion member together with a binding agent that binds the phosphor. The binding agent can be composed of a transparent resin such as epoxy resin, glass, or transparent inorganic material produced from a silicone resin or metal alkoxide with high light resistance as a stating material by a sol-gel method, for example.

In this specification, the particle size of a phosphor is referred to a value obtained by a volume-base particle size distribution curve. The volume-base particle size distribution curve is obtained by the measuring particle size distribution of the phosphor by a laser diffraction and scattering method. Specifically, it can be obtained with measurement of sodium hexametaphosphate aqueous solution, in which the phosphor is dispersed, with 0.05% concentration by laser diffraction type particle size distribution analyzer (SALD-2000A), in the measurement particle size range 0.03 μm to 700 μm, under circumstance of temperature 25° C. and humidity 70%.

The combination of a phosphor containing an aluminum oxide, typically such as YAG group phosphor, and a phosphor capable of emitting luminescent radiation of red range light, particularly, a nitride phosphor, can be used as the phosphor in this embodiment. These YAG group phosphor and nitride phosphor can be mixed and included in the wavelength conversion member, or may be separately included in a plurality of layers which compose the wavelength conversion member. Hereinafter, each phosphor will be described.

(Aluminum Oxide Group Phosphor)

The aluminum oxide group phosphor employed in this embodiment contains Al, at least one element selected from the group consisting of Y, Lu, Sc, La, Gd, Tb, Eu, and Sm, and least one element selected from the group consisting of Ga and In. The aluminum oxide group phosphor is activated by at least one element selected from the group consisting of rare earth elements. This aluminum garnet group phosphor is excited by visible light or ultraviolet rays emitted from an LED chip, and emits luminescent radiation.

$YAlO_3:Ce$, $Y_3Al_5O_{12}:Ce$, $Y_4Al_2O_9:Ce$, $(Y_{0.8}Gd_{0.2})_3Al_5O_{12}:Ce$, $Y_3(Al_{0.8}Ga_{0.2})_5O_{12}:Ce$, $Tb_{2.95}Ce_{0.05}Al_5O_{12}$, $Y_{2.90}Ce_{0.05}Tb_{0.05}Al_5O_{12}$, $Y_{2.94}Ce_{0.05}Pr_{0.01}Al_5O_{12}$, and $Y_{2.90}Ce_{0.05}Pr_{0.05}Al_5O_{12}$ can be given as the example. Particularly, in this embodiment, two or more kinds of yttrium-aluminum-garnet phosphors (hereinafter, occasionally referred to as "YAG group phophors") that are types of yttrium aluminum oxide group phosphors and have different compositions that contain Y and are activated by Ce or Pr can be employed. Particularly, in use for high luminance and for a long time, it is preferable that $(Re_{1-x}Sm_x)_3(Al_{1-y}Ga_y)_5O_{12}$:Ce (wherein, $0 \leq x \leq 1$, $0 \leq y \leq 1$, and Re represents at least one element selected from the group consisting of Y, Gd, and La), or the like, is employed.

In the composition of YAG group phosphor, substituting Ga for a part of Al shifts the emission spectrum toward the shorter wavelength side. Substituting Gd and/or La for a part of Y in the composition shifts the emission spectrum toward the longer wavelength side. Thus, varying composition can continuously adjust the luminescent color. Accordingly, YAG group phosphor provide the ideal condition for converting to white light emission from blue light emission of nitride semiconductor since continuous variation of intensity in the long wavelength side is obtained by varying composition ratio of Gd, and so on. When the substitution of Y is less than twenty percent, the green component increases and the red component reduces. On the other hand, when it is than eighty percent or more, the red component increases but luminance sharply reduces. In addition, similarly to the excitation absorption spectrum, in the composition of YAG group phosphor with garnet structure, substituting Ga for a part of Al shifts the excitation absorption spectrum to the shorter wavelength side. Substituting Gd and/or La for a part of Y in the composition shifts the excitation absorption spectrum to the longer wavelength side. It is preferable that the peak wavelength of the excitation absorption spectrum of YAG group phosphor is in the short wavelength side relative to the peak wavelength of the emission spectrum of light emitting element. In this construction, when a current supplied to a light emitting element is increased, the peak wavelength of the excitation absorption spectrum substantially agrees with the peak wavelength of the emission spectrum of light emitting element. Accordingly, it is possible to provide a light emitting apparatus in which occurrence of chromaticity deviation is kept in check without reduction of excitation efficiency of phosphor.

The aluminum garnet group phosphor can be produced as follows. First, as for the phosphor, an oxide or a compound, which easily becomes into an oxide at high temperature, of Y, Gd, Ce, La, Al, Sm, Pt, Tb, and Ga is employed as a starting material, and then the material is obtained by sufficiently mixing them at the stoichiometric ratio. Alternatively, a mixed material is obtained by mixing a coprecipitated oxide with an aluminum oxide and a gallium oxide. The coprecipitated oxide is obtained by burning a material obtained by coprecipitating solution, in which a rare earth element of Y, Gd, Ce, La, Sm, Pr, and Tb are dissolved in acid, using an oxalic acid at the stoichiometric ratio. After mixing the mixed material and an appropriate amount of fluoride such as ammonium fluoride as flux, inserting them into a crucible, then burning them at 1350° C. to 1450° C. in air for 2 hours to 5 hours, as a result, a burned material can be obtained. Next, the burned material is crushed in water by a ball mill. Then by washing, separating, drying it, finally sifting it through a sieve, the photo-luminescent phosphor can be obtained. Additionally, a method for producing a phosphor according to another embodiment includes two steps for burning. In a first burning step, mixture composed of mixed material, in which a material of phosphor is mixed, and flux is burned in the air or a weak reducing atmosphere. In a second burning step, the mixture is burned in a reducing atmosphere. The weak reducing atmosphere refers to a reducing atmosphere with low effect including at least a necessary amount of oxygen to form a desired phosphor from a mixed material in the reaction process. The first burning process is performed in this weak reducing atmosphere until desired structure formation of the phosphor is completed, thus, it is possible to prevent a phosphor from turning to black, and light-absorption efficiency from reducing. The reducing atmosphere in the second burning process refers to a reducing atmosphere with high effect stronger than the weak reducing atmosphere. In the case of two steps for burning as discussed above, a phosphor with high absorption efficiency of excitation wavelength is obtained. Accordingly, when a light emitting apparatus is formed by using the phosphor formed as discussed above, the amount of phosphor necessary for obtaining desired color tone can be reduced. Therefore, it is possible to provide a light emitting apparatus with high light-outgoing efficiency.

(Lutetium-Aluminum-Garnet Group Phosphor)

The lutetium-aluminum-garnet group phosphor is a phosphor generally represented by $(Lu_{1-a-b}R_aM_b)_3(Al_{1-c}Ga_c)_5O_{12}$ (wherein R represents at least one element of rare earth elements necessary to include Ce; M is at least one element selected from the group consisting of Sc, Y, La and Ga; and $0.0001 \leq a \leq 0.5$, $0 \leq b \leq 0.5$, $0.0001 \leq a+b<1$, $0 \leq c \leq 0.8$). For example, the lutetium-aluminum-garnet group phosphor can be phosphors represented by the composition formulas $(Lu_{0.99}Ce_{0.01})_3Al_5O_{12}$, $(Lu_{0.9}Ce_{0.10})_3Al_5O_{12}$, and $(Lu_{0.99}Ce_{0.01})_3(Al_{0.5}Ga_{0.5})_5O_{12}$.

The lutetium-aluminum-garnet group phosphor (hereinafter, occasionally referred to as a "LAG group phosphor") can be produced as follows. A lutetium compound, a compound of rare earth element R, a compound of rare earth element M, an aluminum compound, and a gallium compound are used as phosphor materials. The compounds are measured so as to satisfy the ratio of the aforementioned general formula, respectively. Subsequently, these phosphor materials are mixed, or mixed additionally with a flux to obtain a material mixture. This material mixture is filled in a crucible, and is burned at 1200 to 1600° C. in a reducing atmosphere. After cooled, it is dispersed, and thus the phosphor according to the present invention represented by the aforementioned general formula is obtained.

An oxide or a compound such as carbonate and hydroxide, which becomes into an oxide by thermal decomposition, is preferably used as a phosphor material. A coprecipitated material, which contains all of, or some of metallic elements composing the phosphor, can be used as a phosphor material. For example, the coprecipitated material can be obtained by adding an aqueous solution of alkali, carbonate, or the like, to an aqueous solution containing these elements, but it may be used after drying or thermal decomposition. Fluoride, borate, or the like, is preferably used as the flux. It is added within the range of 0.01 to 1.0 parts by weight based on 100 parts of the phosphor material by weight. It is preferable that the burning is performed in a reducing atmosphere where cerium as an activation agent is not oxidized. It is more preferable that the burning is performed in a mixed-gas atmosphere of hydrogen and nitrogen with a hydrogen concentration of 3.0% by volume or less. It is preferable that the burning is performed at 1200 to 1600° C. to obtain a phosphor with a target center particle size. A temperature of 1300 to 1500° C. is more preferable.

In the aforementioned general formula, R is an activation agent, and is at least one element of rare earth elements necessary to include Ce. Specifically, the rare earth elements are Ce, La, Pr, Nd, Sm, Eu, Gd, Tb, Dy, Ho, Er, Tm, Yb, and Lu. R should include Ce, but, may include both Ce and at least one element of rare earth elements other than Ce. The reason is that the rare earth elements other than Ce serve as coactivation agents. R preferably includes 70 mol % or more of Ce based on the total amount of R. The value a (the amount of R) is preferably $0.0001 \leq a \leq 0.5$. If the value "a" is less than 0.0001, the luminance decreases. On the other hand, the value "a" is more than 0.5, the luminance decreases due to concentration quenching. It is more preferable $0.001 \leq a \leq 0.4$, and most preferably $0.005 \leq a \leq 0.2$. The value "b" (the amount of M) is preferably $0 \leq b<0.5$, more preferably $0 \leq b \leq 0.4$, and most preferably $0 \leq b \leq 0.3$. For example, in the case M is Y, if the value "b" is more than 0.5, the luminance decreases in long wavelength ultraviolet rays to short wavelength visible light, particularly in 360 to 410 nm. The value "c" (the amount of Ga) is preferably $0 \leq c \leq 0.8$, more preferably $0 \leq c \leq 0.5$, and most preferably $0 \leq c \leq 0.3$. If the value c is more than 0.8, the light-emission wavelength shifts to the shorter wavelength side, and the luminance decreases.

It is preferable that the center particle size of LAG group phosphor is within a range 1 to 100 μm, more preferably within a range 5 to 50 μm, and most preferably within a range 5 to 15 μm. A phosphor with center particle size of less than 1 μm tends to form aggregate. The phosphor with the particle size within a range 5 to 10 μm has a high light absorption coefficient and a high conversion efficiency, and aids formation of the light conversion member. When the phosphor having the particle size with excellent optical features is employed, the mass-producibility of light emitting apparatus is improved. It is preferable that the content of the phosphor with the above center particle size is high. It is preferable that its content is 20 to 50%. Accordingly, employing the phosphor having a sharper distribution of the particle size rather than a broader one can further reduce unevenness of the color, and the light emitting apparatus with an excellent color tone can be provided.

Since the lutetium-aluminum-garnet group phosphor is efficiently excited by ultraviolet rays or visible light of a wavelength range between 300 nm and 550 nm and emits luminescent radiation, it can be effectively used as the phosphor contained in the light conversion member. In addition, in the case where two or more kinds of LAG group phosphors with different composition formulas are employed, or the LAG group phosphor is employed together with other kind of phosphor, the color of light emission of the light emitting apparatus can be varied. A conventional light emitting apparatus mixes bluish light emitted by a semiconductor light emitting element with yellowish luminescent radiation by a phosphor that absorbs the emitted light, and emits whitish mixed light. Accordingly, since light from the light emitting element partially passes for utilization, this type of apparatuses has advantages in that its structure can be simplified and its output is easily improved. On the other hand, since the above light emitting apparatus emits light consisting of mixed two colors, its color rendering is not sufficient. Therefore, improvement has been required. The light emitting apparatus that emits white range mixed light by employing the LAG group phosphor can improve color rendering as compared with such a conventional light emitting apparatus. Additionally, since the LAG group phosphor has excellent temperature characteristics as compared with the YAG group phosphor, it is possible to provide a light emitting apparatus that less deteriorates and has less color difference.

(Nitride Group Phosphor)

The phosphor used in the present invention can be a nitride group phosphor that contains N, at least one element selected from the group consisting of Be, Mg, Ca, Sr, Ba and Zn, and at least one element selected from the group consisting of C, Si, Ge, Sn, Ti, Zr and Hf, and is activated by at least one element selected from the group of rare-earth elements. A nitride group phosphor is a phosphor capable of emitting red range luminescent radiation, and is excited by absorbing visible light, ultra-violet light, or luminescent radiation from other phosphor (e.g., YAG group phosphor), and thus emit luminescent radiation. That is, this nitride group phosphor absorbs a part of light (e.g., blue light) emitted by the light emitting device, and emits luminescent radiation of a range between yellow and red. It is preferable that a light emission spectrum that excites the nitride group phosphor is 360 nm to 495 nm. In addition, the light emission spectrum preferably includes wavelength in proximity to 440 nm to 480 nm. A light emission spectrum of the nitride group phosphor preferably includes peak wavelength at approximately 560 nm to 700 nm. More preferably, it includes peak wavelength at approximately 600 nm to 680 nm. $Sr_2Si_5N_8$:Eu, Pr; $Ba_2Si_5N_8$:Eu, Pr; $Mg_2Si_5N_8$:Eu, Pr; $Zn_2Si_5N_8$:Eu, Pr; $SrSi_7N_{10}$:Eu, Pr; $BaSi_7N_{10}$:Eu, Ce; $MgSi_7N_{10}$:Eu, Ce can be given as examples, but the nitride group phosphor is not limited to them.

Particularly, this phosphor is preferably a nitride group phosphor with Mn added thereto. Added Mn accelerates diffusion of $Eu^{2+}$, and improves light-emission luminance, light-emitting efficiency such as energy efficiency and quantum efficiency. The basic component elements of this phosphor is represented by general formulas $L_XSi_YN_{(2/3X+4/3Y)}$:Eu or $L_XSi_YO_ZN_{(2/3X+4/3Y-2/3Z)}$:Eu (wherein L represents Sr, Ca, or Sr and Ca). It is preferable that X and Y in the general formulas are X=2, Y=5, or X=1, Y=7, but arbitrary values can be used. Specifically, it is preferable that fluorescent materials represented in Mn-added $(Sr_XCa_{1-X})_2Si_5N_8$:Eu; $Sr_2Si_5N_8$:Eu; $Ca_2Si_5N_8$:Eu; $Sr_XCa_{1-X}Si_7N_{10}$:Eu; $SrSi_7N_{10}$:Eu; or $CaSi_7N_{10}$:Eu are employed. Here, the fluorescent material may include at least one element selected from the group consisting of Mg, Sr, Ca, Ba, Zn, B, Al, Cu, Mn, Cr, and Ni. L is any element of Sr, Ca, Sr, and Ca. The composition ratio of Sr and Ca can be varied, if desired. Employing Si in composition of the fluorescent material can provide the low cost fluorescent material with preferable crystallinity.

A process for producing the phosphor (($Sr_XCa_{1-X})_2Si_5N_8$:Eu), which can be employed in the present invention, is now described as follows. However, the present invention is not limited to this process.

First, materials Sr and Ca are pulverized and are nitrided in a nitrogen atmosphere. Similarly, a material Si is nitrided in a nitrogen atmosphere, and then, silicon nitride is obtained. Subsequently, nitride of Sr, Ca, or Sr—Ca is pulverized. The nitride of Sr and Ca, or the Sr—Ca nitride is pulverized in an argon atmosphere or a nitrogen atmosphere, in a glove box. Likewise, the nitride of Si that is obtained by pulverizing the material Si and nitriding it and a compound of Eu, $Eu_2O_3$ are pulverized. The above materials may contain at least one element selected from the group consisting of Mg, Sr, Ca, Ba, Zn, B, Al, Cu, Mn, Cr, O, and Ni. In addition, an adjusted content of the above element such as Mg, Zn, and B may be mixed in the following processes. Finally, the mixture of the nitride of Sr, Ca, and Sr-Cr with Mn added thereto, the nitride of Si, and the compound of Eu, $Eu_2O_3$ is burned in an ammonia atmosphere, and then the phosphor, represented by the formula $(Sr_XCa_{1-X})_2Si_5N_8$:Eu, which further includes Mn, can be obtained.

A tubular furnace, a small furnace, a high-frequency furnace, a metal furnace, and so on, can be used for burning. The burning is performed at burning temperature in the range of 1200 to 1700° C., but it is preferable that the burning temperature is 1400 to 1700° C. It is preferable to use single-stage burning where burning is conducted while gradually increasing the temperature from 1200 to 1500° C. for several hours. However, two-stage burning (multi-stage burning) may be used. In the two-stage burning, burning in a first stage is performed from 800 to 1000° C., and burning in a second stage is performed while gradually increasing the temperature from 1200 to 1500° C.

(Alkaline-Earth Metal Silicate)

The light emitting apparatus employed in this embodiment can include an alkaline-earth metal silicate activated by europium as a phosphor that absorbs a part of light emitted by the light emitting element and emits luminescent radiation of wavelength different from the absorbed light. An alkaline-earth metal silicate can provide a light emitting apparatus, which can emit warm mixed light by using light of the blue range as excitation light. It is preferable that this alkaline-earth metal silicate is an alkaline-earth metal orthosilicate represented by the following general formula.

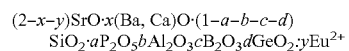

(wherein 0<x<1.6, 0.005<y<0.5, and 0<a, b, c and d<0.5)

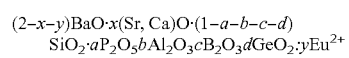

(wherein 0.01<x<1.6, 0.005<y<0.5, and 0<a, b, c and d<0.5)

In this case, it is preferable that at least one of the values a, b, c and d is more than 0.01.

The light emitting apparatus according to this embodiment can include an alkaline-earth metal aluminate activated by europium and/or manganese, Y(V, P, Si)$O_4$:Eu, and an alkaline-earth metal-magnesium-disilicate represented by the following formula as a phosphor of alkali-earth metal salt in addition to the aforementioned alkaline-earth metal silicate.

Me(3−x−y)MgSi$_2$O$_3$:xEu, yMn (wherein 0.005<x<0.5, 0.005<y<0.5, and Me represents Ba and/or Sr and /or Ca).

A producing method of the phosphor of alkaline-earth metal silicate phosphor employed in this embodiment is now described below. In production of the alkaline-earth metal silicate, depending on a selected composition, stoichiometric amounts of alkaline-earth metal carbonate, silicon dioxide and europium oxide are thoroughly mixed, and they are converted into a desired phosphor at temperatures of 1100° C. and 1400° C. in a reducing atmosphere by solid reaction typically used in production of a phosphor. In this case, less than 0.2 mol of ammonium chloride or other chloride is preferably added. In addition, germanium, boron, aluminum, and phosphorus can be substituted for a part of silicon, or manganese can be substituted for a part of europium, if necessary.

The aforementioned phosphors, that is, one or combination of an alkaline-earth metal aluminate activated by europium and/or manganese, Y(V, P, Si)O$_4$:Eu, and Y$_2$O$_2$S:Eu$^{3+}$ can obtain light-emission of a desired color temperature and high color reproduction characteristics.

(Other Phosphor)

In this embodiment, a phosphor that is excited by light from ultraviolet to visible range and emits luminescent radiation can be used. Specifically, the following phosphors can be given as examples of the phosphor.

(1) an alkaline-earth halogen apatite phosphor activated by Eu, Mn, or Eu and Mn, for example, M$_5$(PO$_4$)$_3$(Cl, Br):Eu (where M represents at least one element selected from the group consisting of Sr, Ca, Ba, and Mg), Ca$_{10}$(PO$_4$)$_6$ClBr:Mn, Eu, (2) an alkaline-earth metal aluminate phosphor activated by Eu, Mn, or Eu and Mn, for example, BaMg$_2$Al$_{16}$O$_{27}$:Eu; BaMg$_2$Al$_{16}$O$_{27}$:Eu, Mn; Sr$_4$Al$_{14}$O$_{25}$:Eu; SrAl$_2$O$_4$:Eu; CaAl$_2$O$_4$:Eu; BaMgAl$_{10}$O$_{17}$:Eu; BaMgAl$_{10}$O$_{17}$:Eu, Mn; and so on (3) an rare-earth oxide sulfide activated by Eu, for example, La$_2$O$_2$S:Eu, Y$_2$O$_2$S:Eu, Gd$_2$O$_2$S:Eu, (4) (Zn, Cd)S:Cu; Zn$_2$GeO$_4$:Mn; 3.5 MgO·0.5 MgF$_2$·GeO$_2$:Mn; Mg$_6$As$_2$O$_{11}$:Mn; (Mg, Ca, Sr, Ba)Ga$_2$S$_4$:Eu; Ca$_{10}$(PO$_4$)$_6$FCl:Sb, Mn (5) an organic complex phosphor activated by Eu As for these phosphors, one phosphor can be used, or more than one phosphor can be mixed in a wavelength conversion member composed of a single layer. Alternatively, they can be used individually or mixed in each layer of a wavelength conversion member composed of two or more layers.

(Semiconductor Device)

A photo sensor that varies its resistance when receiving light, a solar cell that generates an electromotive force when receiving light, and an LED or an LD (laser diode) that emits light by supplied electric power can be given as examples of the semiconductor device. In addition, a Zener diode and a capacitor can be given as examples of a protection device 111 that protects these semiconductor devices from breakdown due to overvoltage. As for these types of semiconductors devices, if required, two or more devices can be provided, or two or more types of devices can be provided. Specifically, a photo sensor and an LED can be combined as a photocoupler, or light emitting diodes that can emit RGB light for full-color emission can be combined, for example.

A device that employs silicon or germanium of single crystal, polycrystal that is a non-single crystal, microcrystal, or amorphous structure can be given as examples of photoreceptor device. The photoreceptor device can have a semiconductor junction such as PIN, PN and IN, or may not have a semiconductor junction. In case where amorphous silicon is employed as the photoreceptor device, a silicon thin film can be formed on a glass substrate by a plasma CVD method. A pair of electrodes are deposited on the formed semiconductor surface, and thus a photo sensor can be relatively easily formed.

On the other hand, a device that is provided with a light emitting layer of gallium nitride, gallium phosphide, gallium arsenide phosphide, gallium aluminum phosphide, gallium aluminum indium phosphide, indium gallium nitride, indium aluminum gallium nitride formed on or above a substrate by a MOCVD method can be given as a light emitting device. Homo structure, hetero structure, or double-hetero structure with MIS junction or PN junction can be used as a semiconductor layer structure. Various light-emission wavelengths can be selected depending on materials and mixed crystal ratios of semiconductor layer. The semiconductor layer can have a single- or multi-quantum-well structure provided with thin layer(s) for quantum effect.

(Conductive Wiring Member)

The conductive wiring member in this embodiment is a member that connects an external electrode of the semiconductor apparatus and the semiconductor device disposed on the support member. A conductive pattern formed on the support member and a lead frame embedded in the support member can be given as examples of the conductive wiring member. The conductive wiring member can be formed in various sizes in consideration of heat diffusion, electrical conductivity and characteristics of the semiconductor. In order to efficiently externally dissipate heat that is generated by the semiconductor device, the conductive wiring member preferably has high heat conductivity. Specifically, heat conductivity is preferably 0.01 cal/(s)(cm$^2$)(° C./cm) or more, and more preferably 0.5 cal/(s)(cm$^2$)(° C./cm) or more. Electrical resistance of the conductive wiring member is preferably 300 μΩ·cm or less, and more preferably 3 μΩ·cm or less.

Copper, and a phosphor bronze plate plated with metal such as silver, palladium and gold, or with solder on its surface can be given as examples of the conductive wiring member that is provided on the support member. Alternatively, in the case where the support substrate is composed of a substrate that is made of a glass epoxy resin or a BT resin, copper foil and a tungsten layer plated with a noble metal thereon can be used as the conductive wiring member.

In an example of method for forming the conductive wiring member on the support member made of a ceramic material, a resin paste containing tungsten or molybdenum is printed on a green sheet and then burned. In addition, a metallic material containing nickel (Ni), gold (Au) and silver (Si) is laminated on the tungsten or molybdenum that is coated on the support member, and thus the conductive wiring member also serves as a light reflector. Alternatively, the conductive wiring member can be integrally formed in a process for forming the metallic material that is formed on the side wall of the recessed portion. This type of metallic material can be formed by various formation processes such as plating, sputtering, vapor deposition, or combination of them.

(Conductive Wire)

The conductive wire is a member that electrically connects the electrode of the semiconductor device and a lead terminal or conductive wiring member of the support member. Note that, in the case where electrodes of the semiconductor device are opposed to lead terminals or conductive wiring members and are electrically and mechanically connected with conductive members such as metal bumps, the conductive wire is not an indispensable member in the present invention.

The conductive wire is required to provide good ohmic contact and mechanical connection with the electrode of the semiconductor device and high electrical conductivity and heat conductivity. The heat conductivity is preferably 0.01 cal/(s)(cm$^2$)(° C./cm) or more, and more preferably 0.5 cal/(s)(cm$^2$)(° C./cm) or more. The diameter of the conductive wire is preferably not more than 10 μm or more and 45 μm or less in consideration of workability and so on. Specifically, a metal such as gold, copper, platinum, aluminum, and an alloy of them can be given as an suitable example of the conductive wire.

This type of conductive wire is connected (wire-bonded) in various manners depending on forms of the electrode of the semiconductor device. That is, in the case where the semiconductor includes a pair of positive and negative electrodes in the same plane side, each of the pair of positive and negative electrodes is connected to a lead terminal with the conductive wire. In case where the semiconductor includes positive and negative electrodes that are formed on the front surface and the back surface thereof, one electrode is connected to a lead terminal on which the semiconductor device is fastened by die-bonding, and another electrode is connected to a lead terminal with the conductive wire. In the above wire bonding, the conductive wire is bonded by means of a wire bonding instrument, and thus it is possible to easily connect the electrode of the semiconductor device and the conductive wiring member provided on the support member.

(Die-Bonding Member)

A die-bonding member in this embodiment is a member that fastens the semiconductor device on the support member. The semiconductor device can be fastened on the support member with the die-bonding member of a thermosetting resin as an adhesive agent, for example. Specifically, epoxy resin, acrylic resin or imide resin can be used. In order to adjust the thermal expansion coefficient of the die-bonding member, these resins may contain a filler. This can suppress peeling-off of the semiconductor device from the support member.

Ag paste, carbon paste, ITO paste, metal bump or the like can be used for die-bonding the semiconductor device and electrically connecting it to external terminals of the support member.

EXAMPLE 1

Examples according to the present invention will be described, but, needless to say, the present invention is not limited to these examples.

FIG. 1 shows a plan view schematically showing a semiconductor apparatus according to this example. FIG. 2 shows a cross-sectional view along a line I-I of FIG. 1. FIG. 3 is an enlarged partial cross-sectional view showing a semiconductor apparatus according to one embodiment of the present invention inside a circle of FIG. 2.

A semiconductor apparatus 100 according to this example includes a support member 110 that has a recessed portion in which a light emitting device is mounted, and a coating member 108 that covers the light emitting device 103 and a conductive wire 102 and contains a phosphor substance 109. The semiconductor apparatus 100 is provided with cut-off portions at four corners of the support member. A conductive wiring member 101 that is electrically connected to an external terminal is exposed in the cut-off portion. The conductive wiring member 101 is electrically connected to a conductive wiring member 104 formed on the support member 110.

A side wall that forms a recessed portion of the support member 110 has a first side wall 105 that surrounds the light emitting device 103 in the bottom side of the recessed portion and gradually increases its diameter toward the opening direction of the recessed portion, and a second side wall 106 that protrudes in the opening side of the recessed portion inwardly of the recessed portion. A metallic material is formed on a wall surface 105a of the first side wall 105 and a first wall surface 106a of the second side wall 106. The coating member 108 coats the top surface of the metallic material, and fills the recessed portion so as to reach at least a second wall surface 106b of the second side wall 106.

The metallic material according to this example will be described in more detail. The top surface of the metallic material formed on the wall surface 105a has a convex curved surface that protrudes toward the coating member 108. The metallic material, which is formed from the wall surface 105a to the first wall surface 106a, has a curved surface that is bowed toward the corner defined by the wall surface 105a and the first wall surface 106a. In addition, as shown in FIG. 3, the metallic material has a tangent plane at the top surface of the metallic material intersects the second side wall 106.

Accordingly, the support member can ensure to serve as means for retaining the coating member 108 with the second side wall 106, and additionally suppresses air bubbles that remain at the corner. In addition, air bubbles that are included in a material forming the coating member are also efficiently removed from the recessed portion, therefore, it is possible to provide a semiconductor apparatus without deterioration of optical characteristics.

The metallic material is a metal film composed of a first metallic material 301 of tungsten as a primary layer, a second metallic layer 302 of nickel (Ni), and a third metallic material 303 of silver (Ag) as the top surface that are successively laminated. Among them, since silver has high reflectivity of light from the light emitting device, it is suitably selected as a metallic material of the top surface of the metallic film. A metallic material that has good bonding characteristics (i.e., good wettability) with the first metallic material 301 and the third metallic material 302 is suitably selected as the second metallic material that is interposed between the first metallic material 301 and the third metallic material 302. From this point of view, nickel, which has good bonding characteristics with tungsten and silver, is selected.

The support member 110 according to this example is formed by employing a ceramic material as follows. First, a ceramic green sheet containing alumina as a principal component is cut into a predetermined shape to obtain first to fourth ceramic sheets.

Thus-obtained first ceramic green sheet has a through-hole with bore of about 2.6 mm to form the second side wall 106 in the recessed opening side.

Similarly, the second ceramic green sheet that has a through-hole with a larger bore of about 2.8 mm is formed. The second ceramic green sheet forms the second side wall 105. The above through-hole gradually increases its bore toward one principle surface direction to form the wall surface 105a of the first side wall 105 in a bowl shape. That is, the above through-hole has the maximum bore of about 2.8 mm and the minimum bore of about 2.5 mm. The first ceramic green sheet is laminated on the opening side with the minimum bore, and thus a part of the second side wall 106 protrudes inside the recessed portion.

In addition, the third ceramic green sheet that has a through-hole with a bore of about 2.5 mm is formed. After the third ceramic green sheet is burned, it serves as a third side wall 201 located in the bottom side of the recessed portion.

Additionally, the fourth green sheet is formed to enclose the through-hole that are formed in the aforementioned first to third ceramic green sheets and to form the recessed portion. After the fourth ceramic green sheet is burned, it serves as a substrate located on the bottom of the recessed portion, and is provided with the conductive wiring member. The recessed portion of the support member 110 according to this example has a depth of about 0.6 mm.

Subsequently, in order to form the metallic material on a back surface of the second side wall 106, a resin paste containing tungsten is printed in a predetermined area on one principle surface of the first ceramic green sheet by screen printing. In this case, the resin paste is provided in the periphery of the through-hole, particularly in an area corresponding to the first wall surface 106a of the protrusion.

Likewise, the through-hole of the second ceramic green sheet is filled with a resin paste containing tungsten by screen printing. A redundant paste is removed such that the paste is provided on the inner wall surface of the through-hole at a predetermined thickness. In this case, the resin paste containing tungsten is provided on the inner wall surface of the through-hole in a convex shape that expands due to its surface tension. After burned, the resin paste containing tungsten serves as a primary layer of a metallic material 107 containing tungsten.

Likewise, a conductive paste of tungsten is provided as a primary layer of the conductive wiring member 104 on the side of the fourth ceramic green sheet that serves as the bottom of the recessed portion where the light emitting device is mounted by screen printing.

The aforementioned first to fourth ceramic green sheets are laminated and applied with pressure, and thus a laminated structural component is obtained. The metallic member that has a curved surface bowed toward the corner defined by the first side wall surface and the first wall surface 106a can be formed by using surfacetension of or adjusting viscosity of a resin paste that is provided on the first and the second ceramic green sheets. After the laminated structural component is burned, Ni, Au and Ag are successively laminated as metallic materials on the primary layer of tungsten by electroplating. Accordingly, the conductive wiring member and the metal film on the recessed portion side wall are formed in the same plating process. Note that the first metallic material (Ni) and the second metallic material (Au) and the third metallic material that are successively laminated on tungsten that is the first metallic material are not illustrated in FIGS. 2 and 3 for the sake of brevity.

The light emitting device employed in this embodiment is an LED chip that has an $In_{0.2}Ga_{0.8}N$ semiconductor with a main light emission wavelength of 460 nm. ATMG (trimethyl gallium) gas, a TMI (trimethyl Indium) gas, a nitrogen gas and a dopant gas are flowed together with a carrier gas to a cleaned sapphire substrate, and then the LED chip is formed by growing gallium nitride group compound semiconductor layers by MOCVD process. Gallium nitride group semiconductors with n-type and p-type conductivities are formed by changing between $SiH_4$ and $Cp_2Mg$ as dopant gases, and thus a PN junction is formed.

In the light emitting semiconductor device, a contact layer of gallium nitride with n-type conductivity, a cladding layer of gallium aluminum nitride semiconductor with p-type conductivity, and a contact layer of gallium nitride with p-type conductivity are formed. An active layer of InGaN is formed between the contact layer with n-type conductivity and the cladding layer with p-type conductivity. In addition, a gallium nitride semiconductor is formed on the sapphire substrate at low temperature, and serves as a buffer layer. The semiconductors with p-type conductivity are annealed at 400° C. or higher after grown.

After the p-type and n-type contact layer surfaces on or above the sapphire substrate are exposed by etching, p-type and n-type electrodes are formed-thereon by sputtering, respectively. After scribing lines are drawn on a semiconductor wafer formed as described above, it is divided into LED chips of 600 μm square by external force.

The LED chip is die-bonded in the central part of the recessed portion of the bottom surface of the support member with an epoxy resin as an adhesive agent. After the adhesive agent is heated at 140° C. for two hours and is cured, the electrodes of the LED chip are connected to the conductive wiring members with gold wires with a diameter of 30 μm by wire-bonding.

A phosphor to be included in the coating member is formed as follows. First, a solution, in which rare-earth elements of Y, Gd and Ce are dissolved in acid at the stoichiometric ratio, is coprecipitated using an oxalic acid. A mixed material is obtained by mixing a coprecipitated oxide that is obtained by burning the coprecipitated material with an aluminum oxide. After mixing the mixed material and ammonium fluoride as flux, putting them into a crucible, then burning them at 1400° C. in air for three hours, a burned material is obtained. The burned material is grinded by a ball mill, washed, separated, dried, and finally sifted through a sieve. Consequently, a phosphor represented by $(Y_{0.8}Gd_{0.2})_3Al_5O_{12}:Ce_{0.03}$ is formed.

The formed phosphor $(Y_{0.8}Gd_{0.2})_3Al_5O_{12}:Ce_{0.03}$ is mixed in a silicone resin of a coating member material at weight ratio of 10:1 and is stirred. The mixture that is sufficiently stirred is filled in the recessed portion of the support member on which the LED chip is disposed. The filling amount is set such that the central surface of the coating member has a concave shape (the depth is about 0.25 mm from the surface) and the principle surface side surface of the support member is not wet with the silicone resin. Subsequently, the silicone resin is heated at 150° C. for two hours and is cured, thus, the coating member that contains the phosphor and is formed in a bowl shape as viewed from the principle surface side of the support member.

Finally, a burned body of ceramic green sheets is divided into pieces of a predetermined shape and size, and the semiconductor apparatus 100 according to the present invention. In addition, a cut-off portion where the conductive wiring member 101 is formed by dividing other through-hole that is plated with the aforementioned metallic material on its inner wall surface in a process for dividing into pieces.

EXAMPLE 2

FIG. 5 shows a partial cross-sectional view showing a semiconductor apparatus according to this example. The support member includes a metallic material that is formed continuously from a first wall surface 106a to a second wall surface 106b adjacent to the first wall surface 106a in a protrusion of a second side wall 106. The top surface of the metallic material formed on a wall surface 105a of a first side wall 105 has a convex curved surface that protrudes toward a coating member 108. The top surface of the metallic material on the second wall surface 106b of the protrusion has a convex curved surface that protrudes inwardly within a recessed portion.

In a formation process of the support member according to this embodiment, the through-hole of the first ceramic green sheet in the example 1 is filled with resin paste containing tungsten by screen printing. A redundant paste is removed such that the paste is provided on the inner wall surface (the second wall surface 106*b*) of the through-hole at a predetermined thickness. Except this construction, other ceramic sheets are formed similarly to the example 1, thus, a laminated structural component of ceramic green sheets is obtained. The laminated structural component is burned, and then Ni/Au/Ag are successively laminated on tungsten to form a conductive wiring member by plating, and thus the support member according to this embodiment.

Except this formation process of the support member, the semiconductor apparatus is configured similarly to the example 1. Accordingly, mechanical strength of the protrusion composed of the second side wall 106 can be improved. Therefore, it is possible to provide a highly reliable semiconductor apparatus.

The metallic material coats the second wall surface 106*b* that is a part of the inner wall surface of the recessed portion such that a porous ceramic base surface is not exposed in an opening of the recessed portion. This structure can suppress light loss in the second wall surface 106*b*. In this example, therefore, a semiconductor apparatus with excellent optical characteristics can be obtained.

EXAMPLE 3

FIG. 6 shows a partial cross-sectional view showing a semiconductor apparatus according to this example. A support member according to this example includes a metallic material that is formed continuously from a first wall surface 106*a* through a second wall surface 106*b* adjacent to the first wall surface 106*a* to a third wall surface 106*c* adjacent to the second wall surface 106*b*. The top surface of the metallic material on the second wall surface and the third wall surface 106*c* of the protrusion is a convex curved surface.

In a formation process of the support member according to this embodiment, the through-hole of the first ceramic green sheet in the example 1 is filled with a resin paste containing tungsten by screen printing. Then, a redundant paste is removed similarly to the example 2. In addition, the resin paste is provided on both surface of the first ceramic green sheet that forms the second side wall 106, that is, on areas corresponding to the first wall surface 106*a* and the second wall surface 106*c*, particularly, on the periphery of the above through-hole. Except this construction, other ceramic sheets are formed similarly to the example 1, thus, a laminated structural component of ceramic green sheets is obtained.

Except this formation process of the support member, the semiconductor apparatus is configured similarly to the example 1. Accordingly, mechanical strength of the protrusion composed of the second side wall 106 can be further improved.

The metallic material entirely coats the protrusion portion such that a porous ceramic base surface is not exposed in an opening of the recessed portion. This can suppress light loss in the opening of the recessed portion. Therefore, a semiconductor apparatus with improved optical characteristics can be obtained.

The present invention can be applied to a semiconductor apparatus with a semiconductor device such as a light emitting diode and a semiconductor laser mounted therein for various indicators, light sensor, display, photocoupler, back light source, optical printer head, and so on.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims. This application is based on Application No. 2004-328319 filed in Japan on Nov. 12, 2004, and No. 2005-93923 filed in Japan on Mar. 29, 2005, the contents of which are incorporated hereinto by reference.

What is claimed is:

1. A semiconductor apparatus comprising:
   a semiconductor device;
   a support member having a recessed portion that mounts the semiconductor device therein, and has a first side wall in the bottom side and a second side wall protruding inwardly within the recessed portion; and
   a coating member that seals the semiconductor device in the recessed portion, wherein
   at least a first wall surface in the bottom side of the recessed portion in wall surfaces of the second side wall is coated with a metallic material,
   a tangent plane at the top surface of the metallic material disposed on the side wall of the recessed portion intersects the second side wall, and
   the metallic material is formed in a convex shape on the wall surface of the first side wall, and is disposed in a concave shape at the corner defined by the first wall surface and the wall surface of the first side wall.

2. The semiconductor apparatus according to claim 1, wherein the metallic material extends from the first side wall to the second side wall.

3. The semiconductor apparatus according to claim 1, wherein the metallic material extends on the second side wall from the first wall surface toward an adjacent wall surface.

4. The semiconductor apparatus according to claim 1, wherein the coating member is composed of a material including at least one selected from the group consisting of silicone resin and epoxy resin.

5. The semiconductor apparatus according to claim 1, wherein the support member is composed of ceramic.

6. The semiconductor apparatus according to claim 1, wherein the metallic material contains at least one element selected from the group consisting of tungsten (W), molybdenum (Mo), manganese (Mn) and tantalum (Ta).

7. The semiconductor apparatus according to claim 1, wherein a tangent plane at the top surface of the metallic material disposed on the side wall of the recessed portion contacts, but does not intersect, the second side wall.

8. The semiconductor apparatus according to claim 1, wherein the semiconductor device is a semiconductor light emitting device.

9. The semiconductor apparatus according to claim 1, wherein the semiconductor device is a photoreceptor.

* * * * *